INVENTOR.
ALVA I. ARCHER

BY Bruce C Lutz

ATTORNEY

July 1, 1969 A. I. ARCHER 3,453,507

PHOTO-DETECTOR

Filed April 4, 1967 Sheet 2 of 2

INVENTOR.
ALVA I. ARCHER

BY Bruce C Lutz

ATTORNEY

United States Patent Office 3,453,507
Patented July 1, 1969

3,453,507

PHOTO-DETECTOR

Alva I. Archer, Clearwater, Fla., assignor to Honeywell Inc., Minneapolis, Minn., a corporation of Delaware Filed Apr. 4, 1967, Ser. No. 628,361
Int. Cl. H01l 15/06
U.S. Cl. 317—235 10 Claims

ABSTRACT OF THE DISCLOSURE

This disclosure illustrates an integrated field effect transistor array designed to sense light patterns.

The field effect transistors are designed with two gates with one gate buried and having an impurity concentration designed for good photo-effect characteristics and the other gate designed for good electrical control.

BACKGROUND OF THE INVENTION

This invention relates to semiconductor apparatus and more specifically to an integrated semiconductor array for use as an optical sensor.

Optical image processing relates to systems which receive images and operate on those images to obtain useful information therefrom. Optical image processors are used in a variety of applications such as star trackers, map matching systems, optical readers, electro-optical memories, and similar applications. Generally, an optical processing system reruires some type of device which is capable of receiving an optical image and providing electrical output signals indicative of the optical image or pattern received. For example, in a star tracker an image of the star is focused on a light sensor which gives an output signal indicative of the position of the image on the sensor. The output signal can be used as a directional control signal in a space vehicle or missile or the like.

In prior art systems photo cells and arrays of light detecting diodes have been used to convert the optical image to electrical signals. However, such prior art systems have disadvantages such as large size, weight, cost, fabrication difficulties, poor electrical control of the output signal, and similar disadvantages.

SUMMARY OF THE INVENTION

This invention comprises an integrated semiconductor device which takes the form of or can be considered as an integrated array of field effect transistors. This invention is a substantial improvement over tube-type photodetectors because it is much smaller in physical size, operates with lower voltages, and requires less power. It is an improvement over prior art diode detectors because diode detectors require separate output lead connections to each diode to provide individual output signals. This invention provides structure in which the output signals can be taken by simple coincident switching and selection.

The field effect transistor (FET) structure is an improvement over the prior art FET transistor structure because the photo-sensing capabilities of the FET structure used in this invention are optimized.

In this invention there is provided an integrated array in which regions are located or imbedded in a substrate such that the regions are completely surrounded by semiconductor material of a conductivity type opposite to that of the regions. In FET terminology these regions are called gates. A second set of regions or gates is diffused into the structure. The first and second gates are of the same conductivity type semiconductor material. Between the gates a thin layer of semiconductor material of an opposite conductivity type is established. This thin layer is called a channel in FET terminology. Drains are formed in apertures in the second gates and conductors are connected to the drains.

An ordinary FET is designed to provide electrical control between one or more of the gates and the channel to control the flow of current through the channel. The channel conduction of a FET is controlled by biasing the gate so that the charge depletion layer or region extends into the channel. Larger voltage causes the charge depletion region to extend further into the channel until the charge depletion regions from the gates meet and pinch off the channel. It is ordinarily undesirable for good electrical control to have the charge depletion region extend into the gate since the conduction of the channel is being controlled. To obtain a junction where the charge depletion region extends into the channel rather than the gate, the gate is heavily doped or has a high impurity concentration with respect to the channel. Another design consideration of ordinary FET's is that the channel should be narrow so that small control signals have an appreciable effect on the channel conduction.

Photons of electromagnetic radiation or light create hole-electron pairs in semiconductor material. The photons are absorbed by valence electrons which thereby attain a higher energy level. If the energy of an absorbed photon is great enough, the energized electron will become a free charge carrier and the position that it previously occupied in the valence band will also become a free charge carrier called a "hole." These free charge carriers migrate through the semiconductor material undergoing recombination. However, the charge carriers generated in the junction area of a PN junction, that is, in or near the charge depletion region of a PN junction, will be swept across the junction and will add to the junction current. This added current is called the photo current. The net effect of the hole-electron pairs created by the incident photons can be accounted for by assuming that any free charge carriers generated within a diffusion length of the junction will diffuse toward it and will be swept across it by the inherent electric field of the junction. The free charge carriers swept across the junction become a part of the photo-current. Since the width of the charge depletion region depends upon the inpurity concentration and since the number of charge carriers generated in the junction area which add to the photo-current depends upon the width of the charge depletion region, it is evident that for a good photo effect the charge depletion region should be as wide as possible. Since the channel was made narrow for good electrical control it is evident that the gate must have a low impurity concentration for good photo-conductor characteristics since a low impurity concentration will cause the charge depletion region to extend further into the gate thereby becoming wider. Thus, it is seen that the requirements for good electrical control are contradictory to the requirements for good photo-conductive effect.

In the structure of this invention as described above, two gates are provided. One gate is designed with an impurity concentration optimized for good photo-effect characteristics while the other gate is designed with an impurity concentration optimized for good electrical control.

Accordingly, it is an object of this invention to provide a novel electromagnetic radiation sensing array.

It is a further object of this invention to provide an electromagnetic radiation sensing array in which novel field-effect transistor structure is integrated into a substrate to provide a small, low-power photo-sensor.

It is a further object of this invention to provide an integrated field-effect transistor array structure for sensing electromagnetic radiation in which one gate of the field-effect transistor is optimized for electrical control and another gate is optimized for photo-conductive characteristics.

These and other objects and advantages of this invention will become evident to those skilled in the art upon a reading of this specification and the appended claims in conjunction with the attached drawings, of which:

DESCRIPTION OF THE PREFERRED EMBODIMENT

Figure 1:
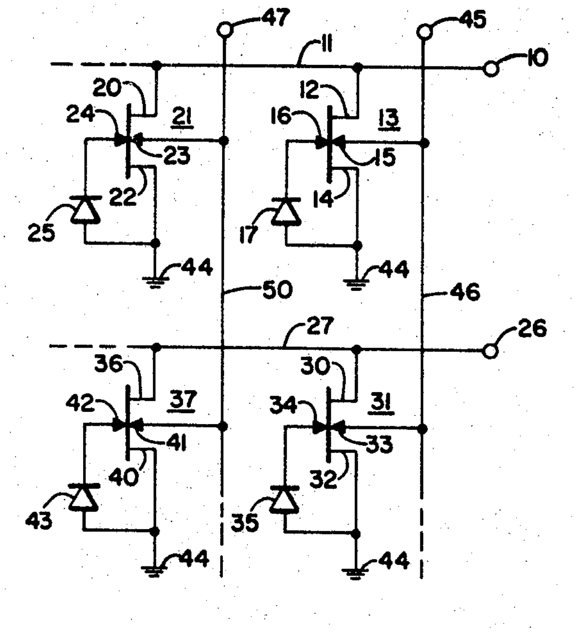
FIGURE 1 is a circuit diagram of the invention.

Referring now to FIGURE 1 there is shown a schematic circuit diagram of an array of field-effect transistors connected so that a coincident selection scheme can be used to select a particular transistor in the array. In FIGURE 1 a 2 x 2 array is shown, however, the size of the array may be extended to any number of transistors desired. An output terminal 10 is connected to a line, lead, or conductor 11 which is connected to an output means or drain 12 of a semi-conductor means, radiation detecting means, current control means, or field-effect transistor means 13. Hereinafter the term FET will be used to denote the active sensor device 13 and similar devices. FET 13 further has a common means or source 14, a biasing means or gate 15, and an input means or gate 16. Gate 16 is connected through a reverse poled PN junction or diode 17 to source 14. Conductor 11 is further connected to an output means or drain 20 of an FET 21 which further has a common means or source 22, a biasing means or gate 23, and an input means or gate 24. Gate 24 is connected through a reverse poled PN junction or diode 25 to source 22.

An output terminal 26 is connected to a line, lead, or conductor 27 which is further connected to an output means or drain 30 of an FET 31. FET 31 further has a common means or source 32, a biasing means or gate 33, and an input means or gate 34 which is connected through a reverse poled PN junction or diode 35 to source 32. Conductor 27 is further connected to an output means or drain 36 of an FET 37 which further has a common means or source 40, a biasing means or gate 41 and an input means or gate 42. Gate 42 is connected through a reverse poled PN junction or diode 43 to source 40.

Sources 14, 22, 32, and 40 are connected in common by means of common conductor which may be connected to ground 44. An input means or terminal 45 is connected to a line, lead, or conductor 46 which is further connected to gate 15 of FET 13 and to gate 33 of FET 31. An input means or terminal 47 is connected to a line, lead, or conductor 50 which is further connected to gate 23 of FET 21 and to gate 41 of FET 37. Conductors 11, 27, 46, and 50 are shown as being terminated by dotted lines which indicate that additional FET's may be added to the array by extending the conductors.

In describing the operation of FIGURE 1 it will first be assumed that potentials are applied to terminals 10, 26, 45, and 47 so that all FET's in the array are biased in a pinch-off condition. The symbol used for FET's 13, 21, 31, and 37 is that of an N-channel device where the gates are of P-type semiconductor material. To reverse bias N-channel FET's, a negative voltage is applied to one or both of the gates and a positive voltage may also be applied to the drain. Of course, if P-channel devices are used, the polarity of the biasing voltages should be reversed. Assume that negative biasing or blocking voltages are applied to terminals 45 and 47 which are sufficiently large to reverse bias FET's 13, 21, 31, and 37 to pinch-off. Further assume that positive biasing or blocking voltages are applied to terminals 10 and 26 and that incident radiation falls on each of FET's 13, 21, 31, and 37. Incident radiation will be hereinafter referred to as light, however, it is to be understood that this invention does not depend upon visible light.

When light falls on the semiconductor material excess hole-electron pairs or charge carriers are generated provided the incident light contains enough energy to excite electrons from the valance band to the conduction band. If the incident light falls on PN junctions so that photons are absorbed in the junction area, i.e., within a diffusion length of the junction, an excess current will be generated which is known as the photo-current. A development of the theory and the equations for this photo-current can be found in R. G. Breckenridge et al., eds., Photo-conductivity Conference, Wiley. The development is given in a section authored by E. S. Rittner, Electron Process in Photo-conductors, pp. 215–268. A similar development can be found in A. van der Ziel, Solid State Physical Electronics, Prentice-Hall, 1957, pp. 379–412. These references show that a PN junction provides a photo-current or a photo-conductive effect when it is illuminated. Of course, no current flows when the terminals of the PN junction are open circuited, however, there will be a photo-voltaic effect, i.e., a photo-voltage.

The output from each FET can be sampled individually. Assume that an output signal is to be taken from FET 37. The reverse bias or blocking voltage is removed from terminal 47 by raising the voltage of terminal 47 to the potential of source 40 or ground to bring FET 37 out of cut-off. Terminal 47 does not necessarily have to be raised to ground potential, that is, terminal 47 could be made positive. When terminal 47 is unblocked, output signals can be taken from either of output terminals 10 or 26 or from both. The output signal from FET 37 is available at output terminal 26. To receive this output signal the blocking voltage is removed from terminal 26 and terminal 26 is connected to a current sensing device. The photons absorbed in the PN junctions of FET 37 create a photo-voltage in FET 37. This photo-voltage controls the current which flows from the channel of FET 37, through drain 36 and conductor 27 to terminal 26. The particular type of current sensor connected to terminal 26 will depend upon the particular use of the FET array. For example, in some applications it will be sufficient merely to determine whether or not FET 37 is illuminated. For this purpose the current sensor will merely determine the presence or absence of a photo-current and a simple trigger or level detector circuit can be used. In other cases it will also be necessary to determine the magnitude of the photo-current and a more elaborate current sensor will be necessary.

It is evident that when terminal 47 is unblocked, output signals can be taken from any FET connected to conductor 50 since all of those FET's will be brought out of cut-off. Thus, an output signal can be taken from FET 21 at the same time an output signal is taken from FET 37. Thus, it is seen that output signals can be taken from each FET in the entire array by simultaneously reading the FET's column-by-column. The output signals are taken from each FET in a manner similar to that described by FET 37.

The output signal can be used in any desired manner. If the FET array is used in a star-tracker, the image of a star would be focused on the array. The array would be used to determine the spatial relationship between a device on which the array is mounted and the star. The output signals from the FET would be used to servo the device to maintain a desired spatial relationship with the star. In other applications, such as an electro-optical memory, the output signals could be interpreted as binary words.

Summarizing the operation of FIGURE 1, it is seen that each individual transistor in the array can be separately selected by applying appropriate signals to one of terminals 10 and 26 and to one of terminals 45 and 47. These signals remove the reverse bias applied to and select the output from the particular FET connected at the cross point in the array. The selected FET then provides an output signal at the selected one of terminals 10 and 26. The presence of an output current is indicative of whether or not the selected FET is illuminated by light and the amplitude of the current is indicative of the intensity of the light.

Figure 2:
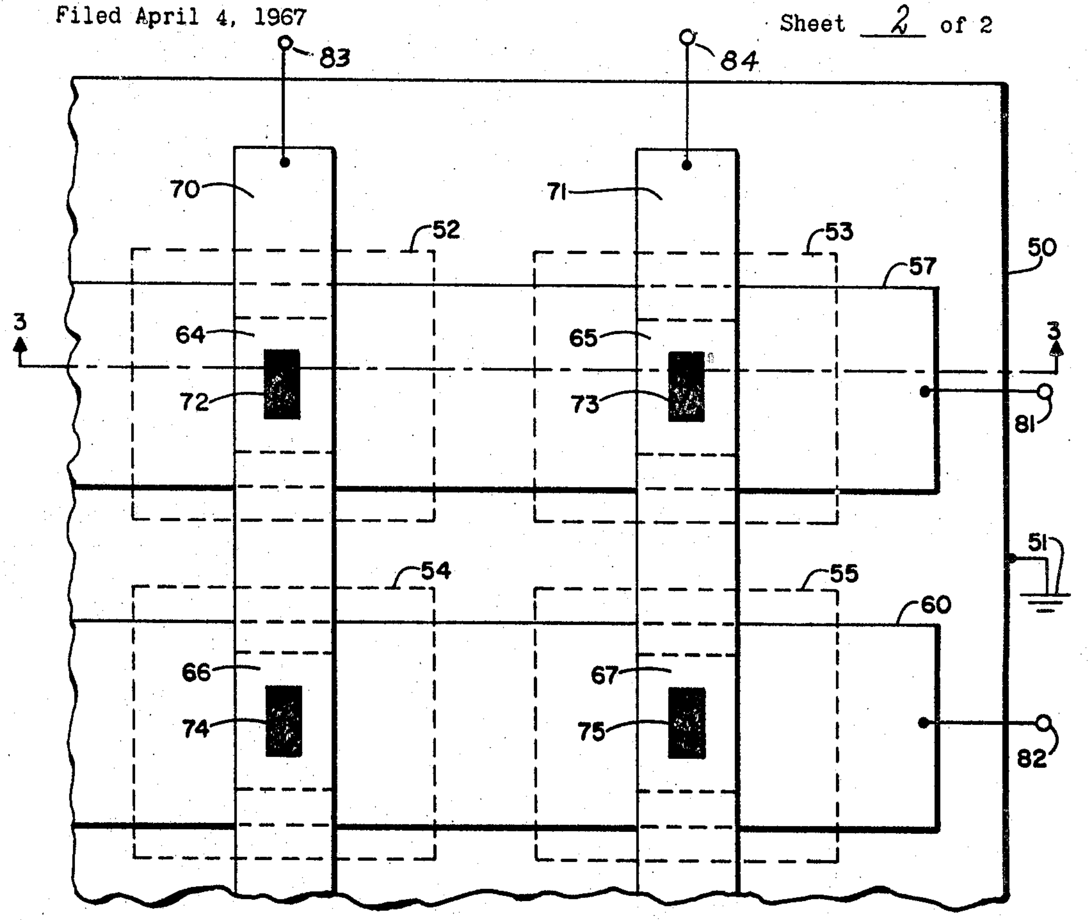
FIGURE 2 is a top or plan view of the integrated structure diagrammed in FIGURE 1.
Figure 3:
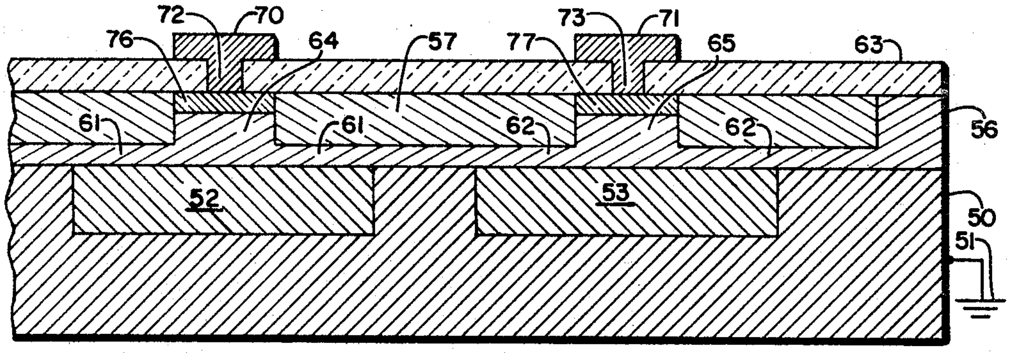
FIGURE 3 is a sectional view of FIGURE 2 taken along line 3—3.

FIGURES 2 and 3 will be described together and similar numbers will be used therein. In FIGURES 2 and 3 there is shown a substrate 50 which is connected to a common conductor such as ground 51. Hereinafter it will be assumed that substrate 50 is a semiconductor material containing N-type impurities so that it is an N conductivity type material. However, it is to be understood that other substrate materials may be used and particularly that P-type semiconductor material may be used for substrate 50. If P-type semiconductor material is substituted for N-type, it will be necessary to changes the type of semiconductor material used in the remainder of the integrated structure. A plurality of areas, regions, or gates 52, 53, 54, and 55 are located in, imbedded in, or diffused into substrate 50. Ordinary diffusion techniques may be used to diffuse P-type impurities into the substrate thereby creating gate regions 52–55. The gates 52–55 are shown in dotted lines in FIGURE 2 since they do not appear at the surface of the semiconductor array. It should be noted that gates 52–55 are all insulated from each other.

A layer of N-type semiconductor material 56 is placed over substrate 50 and gates 52–55 which may be formed in one of two ways. First, substrate 50 and semiconductor material 56 may be a single chip of N-type semiconductor material. Gates 52–55 are then diffused into the chip by ordinary diffusion techniques using P-type impurities. Next, N-type impurities are diffused into semiconductor material 56 to neutralize the P-type impurities which were previously diffused into semiconductor material 56 to form gates 52–55. Second, one can start with substrate 50 and diffuse gates 52–55 into the substrate material. Then an epitaxial process is used to deposit additional N-type semiconductor material 56 on the substrate. With either method gates 52–55 are completely surrounded with N-type semiconductor material so that they are electrically isolated from one another.

A plurality of P-type gates 57 and 60 are located in, embedded in, or diffused into semiconductor material 56. Gates 57 and 60 are parallel strips of P-type semiconductor material which are located over the gates embedded in substrate 57. For example, gate 57 is associated with gates 52 and 53 so that an N-type channel 61 is formed between gates 52 and 57 and a second N-type channel 62 is formed between gates 53 and 57. A layer 63 of $SiO_2$ or similar transparent material is placed over the entire structure for insulation protection and surface passivation. Layer 63 must be transparent to permit light to enter into the semiconductor material. When gates 57 and 60 are formed, areas or regions of N-type semiconductor material 56 are left protruding through apertures in gates 57 and 60 so that drains 64, 65, 66, and 67 are formed. It should be noted that the FET sources are common with substrate material 50. That is, the substrate material 50 between gates 52–55 essentially comprises the sources in FET terminology. Conductive strips 70 and 71 are placed over the $SiO_2$ layer such that each strip crosses each of gates 57 and 60. The conductive strips 70 and 71 make contact with the drains through openings or apertures 72, 73, 74, and 75. In the preferred embodiment conductors 70 and 71 are aluminum. However, when aluminum is placed in contact with N-type semiconductor material, it may cause an inversion to P-type so that a rectifying junction is formed. To prevent PN junctions from forming, small areas 76 and 77 of heavily doped N-type materials may be used.

In FIGURE 1 diodes 17, 25, 35, and 43 are shown. These diodes correspond to the PN junction between gates 52–55 and the substrate material. Since these diodes are also illuminated by incident light, which penetrates the sensor array, they will develop a photo-current. This photo-current will provide a bias current to gates 52–55 which will enhance the output signal. In the absence of incident light no bias will be provided to gates 52–55 by the diodes.

Input terminals 81 and 82 which correspond to terminals 45 and 47 of FIGURE 1 are connected to gates 57 and 60, respectively. Output terminals 83 and 84 which correspond to terminals 10 and 26 of FIGURE 1 are connected to conductors 70 and 71, respectively.

As was mentioned above, it is essential for good electrical control of an FET that channels 51 and 52 be as narrow as possible and that the charge depletion regions extend into the gates as little as possible. To prevent the charge depletion regions from extending into the gates rather than the channels, the impurity concentration of the gates is made large relative to the impurity concentration of the channels. The requirements for good photo-effect characteristics are opposite to the requirements for good electrical control. For high sensitivity the device should absorb as many incident photons as possible. Only those photons absorbed in the junction area, i.e., within a diffusion length of the charge depletion region, create hole-electron pairs which add to the photo-current. Since the channel is ordinarily narrow so that it can be pinched-off, the only way to increase the junction area is to permit the charge depletion regions to extend into the gates. This requirement, however, means that the gates must have a low relative impurity concentration.

The FET's in this invention have been designed with gates 52–55 optimized for photo-conductive characteristics and with gates 57 and 60 optimized for electrical control. Gates 52–55 are lightly doped or have a low relative impurity concentration so that the charge depletion and diffusion length regions extend into the gates for a considerable distance thereby enhancing the photo-conductive characteristics of gates 52–55. Since gates 57 and 60 are to be optimized for electrical control, it is essential that they have a high relative impurity concentration so that the charge depletion region does not extend very far into those gates.

The method of making the structure shown in FIGURES 2 and 3 will now be described. The starting material or substrate is a wafer of N-type silicon having an impurity concentration of about $10^{14}$ impurity atoms per cc. The substrate is masked and placed in a furnace. Gates 52–55 are diffused into the substrate by blowing vapor phase $BBr_3$ impurities mixed with a carrier gas such as $N_2$ across the substrate. Those skilled in the art will realize that gates 52–55 will have a resulting impurity gradient, that is, the concentration of impurity atoms will be less at points deeper in the gates than the concentration at points closer to the surface. The impurity concentration in gates 52–55 should be less than $10^{16}$ impurity atoms per cc. at the channel-gate junctions. The diffusion of gates 52–55 into the wafer requires diffusing boron atoms through region 56. To neutralize the boron impurities in region 56 vapor phase $POCl_3$ is mixed with a carrier gas and blown across the wafer. The resulting surface concentration of impurities in the drain regions should be less than $10^{17}$ impurity atoms per cc. as was noted above, a greater concentration of N-type impurities may be desired in regions 76 and 77 and would require an additional N-type diffusion step after gates 57 and 60 are formed. The next step in forming the integrated structure is to diffuse gates 57 and 60 into region 56. This step is done by applying an appropriate mask and blowing $BBr_3$ across the wafer. The surface concentration of impurities in gates 57 and 60 should be $10^{19}$ impurity atoms per cc.

Finally, the protective coating 63 and conductors 70 and 71 are placed on the integrated structure. Those skilled in the art will realize that the impurity concentrations given above are only examples since the concentrations will vary within the regions and will vary depending upon the application of the array. In some cases the impurity concentrations given may vary by an order of magnitude without seriously degrading the characteristics of the array.

The preferred dimensions of the array are as follows: gates 52–55 are 2 mils by 2 mils with 1 mil of substrate between adjacent gates; drains 64–67 are 1 mil by ¾ mil; contact apertures are ½ mil by ¼ mil; and conductors 70 and 71 are ¾ mil wide. It should be noted that the dimensions shown in FIGURES 2 and 3 are not to scale but are distorted for clarity. For example, channels 61 and 62 are about 20 microinches wide. Generally, the depths of the various regions are exaggerated in FIGURE 2. The dimensions given are not to be considered as limiting the scope of the invention. They are used as examples only. The structure of FIGURES 2 and 3 can also be made using an epitaxial process in part. Gates 52–55 would still be formed by standard diffusion techniques as described above. After gates 52–55 have been diffused into substrate 50, an epitaxial process is used to deposit vapor phase silicon plus impurities onto the substrate thereby forming region 56. The resulting impurity concentration in region 56 should be about $10^{15}$ atoms (N-type) per cc. The impurity concentration of the drains may be increased by diffusion if desired. Gates 57 and 60 are then diffused into region 56.

The structure of FIGURES 2 and 3 basically comprises an FET array similar to that shown in FIGURE 1. Since the operation of the structure shown in FIGURES 2 and 3 is substantially the same as that shown in FIGURE 1, the operation will not be gone into in detail.

Figure 4:
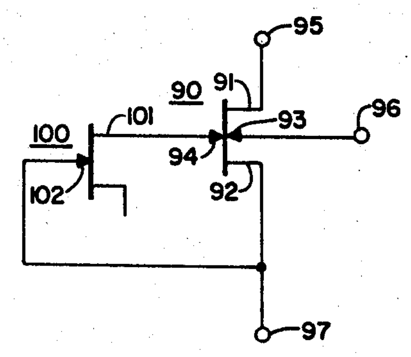
FIGURE 4 is a circuit diagram of a circuit for minimizing the effect of background light.

FIGURE 4 shows a method of compensating for background light. There is shown a first FET 90 which has a drain 91, a source 92, a first gate 93, and a second gate 94. Drain 91 is connected to an output terminal 95. Gate 93 is connected to an input terminal 96. Source 92 is connected to a common terminal 97. A second FET 100 has a drain 101 connected to gate 94 of FET 90 and further has a gate 102 connected to common terminal 97. The background illumination is incident on FET 100 and establishes a bias potential at drain 101. The background illumination plus the image of interest is incident on FET 90. The potential on drain 101 biases gate 94 of FET 90 such that the background illumination incident on FET 90 is effectively cancelled. Thus, the output signal from FET 90 is indicative only of the image of interest.

Structure in accordance with that of FIGURE 4 is not included in the structure shown in FIGURES 2 and 3, however, in situations where background illumination presents a problem, structure similar to that shown in FIGURE 4 can be incorporated into the array to compensate for background illumination.

While I have shown and described one embodiment of my invention, many modifications and variations will be evident to those skilled in the art. Accordingly, I do not wish to be limited by the specific embodiment shown and described but wish to be limited solely by the scope of the appended claims.

I claim as my invention:

1. A semiconductor device comprising, in combination:

electrically conductive substrate means;

first regions of a first conductivity type semiconductor material having a first, relatively low, impurity concentration in contact with said substrate means;

a second region of a second conductivity type semiconductor material having first areas of electrical contact with said first regions and second areas of electrical contact with said substrate means;

third regions of said first conductivity type semiconductor material having a second, relatively high, impurity concentration, opposite said first regions and in contact with said second region, said first and third regions therebetween defining a channel in said second region with said first and second impurity concentrations being low and high, respectively, with respect to the impurity concentration of said channel whereby biasing potentials applied to said third regions control the flow of current in said second region;

means connected to said third regions for applying biasing potentials thereto; and output means connected to said second regions for receiving current flowing in said second regions.

2. A semiconductor device for detecting electromagnetic radiation comprising, in combination:

electrically conductive substrate means;

first semiconductor means of a first conductivity type in electrical contact with said substrate means;

second semiconductor means of a second conductivity type positioned between said first semiconductor means and said substrate means, said second semiconductor means having a first, relatively low, impurity concentration;

third semiconductor means of said second conductivity type positioned adjacent to said first semiconductor means and with said second semiconductor means defining a channel in said first semiconductor means between said second and third semiconductor means, said third semiconductor means having a second, relatively high, impurity concentration, said first and second impurity concentrations being low and high, respectively, with respect to the impurity concentration of said channel;

conductor means in electrical contact with said first semiconductor means; and means for supplying a biasing potential to said third semiconductor means to regulate the flow of charge carriers through said channel.

3. Semiconductor apparatus for detecting electromagnetic radiation comprising, in combination:

semiconductor means of a first conductivity type;

a plurality of first semiconductor regions imbedded in and surrounded by said semiconductor means, said first semiconductor regions being of a second conductivity type semiconductor material having a first, relatively low, impurity concentration;

a plurality of second semiconductor regions of said second conductivity type semiconductor material having a second, relatively high, impurity concentration, each of said second semiconductor regions being associated with a group of said first semiconductor regions whereby channels are formed in said semiconductor means between each of said first semiconductor regions and the associated one of said second semiconductor regions, said first and second impurity concentrations being low and high, respectively, with respect to said channels;

means connected to said second semiconductor regions for biasing said second semiconductor regions with respect to said semiconductor means for controlling the flow of current through said channels; and means connected to said semiconductor means through apertures in said second semiconductor regions for selectively sampling the current flowing in said channels.

4. Semiconductor apparatus as defined in claim 3 wherein said first semiconductor regions are arranged in an array of rows and columns, one of said second semiconductor regions is associated with one of said first semiconductor regions of each of said rows, and said apertures are positioned one over each of said first semiconductor regions where one of said channels is formed between each of said first semiconductor regions and the associated one of said second semiconductor regions.

5. Semiconductor apparatus as defined in claim 4 wherein said means for selectively sampling the current includes conductor strips each connected to said semiconductor means through the apertures corresponding to a column of said first semiconductor regions.

6. Semiconductor apparatus as defined in claim 5 wherein the impurity concentration of said first semiconductor regions is optimized for the creation of charge carriers due to incident electromagnetic radiation to add to the current flowing in said channels.

7. An electromagnetic radiation detecting array comprising, in combination:

electrically conductive substrate means;

a plurality of first regions of a first conductivity type semiconductor material located in a matrix array in said substrate means;

a semiconductor means of a second conductivity type in electrical contact with said substrate means and with each of said first regions whereby said first regions and said semiconductor means form a plurality of first PN junctions therebetween;

a plurality of second regions of said first conductivity type semiconductor in electrical contact with said semiconductor means whereby said semiconductor means and said second regions form a plurality of second PN junctions therebetween, the spatial relationship between said first regions and said second regions being such that said semiconductor means forms a channel between each of said first regions and a corresponding one of said second regions;

means connected to said second regions for biasing said second regions with respect to said substrate means; and conductor means connected to said semiconductor means for selectively sampling the current flowing through said channels.

8. An electromagnetic radiation detecting array as defined in claim 7 wherein said first regions have a low relative impurity concentration with respect to said second regions, the impurity concentration of said first regions being optimized for the generation of charge carriers due to incident electromagnetic radiation.

9. An electromagnetic radiation detecting array as defined in claim 8 wherein said first regions define rows and columns, each of said second regions is associated with a corresponding row of said first regions whereby a channel is formed by said semiconductor means between said second regions and the associated one of said first regions, and said conductor means comprises conductor strips each of which cross each of said second regions and are connected to said semiconductor means through apertures in said second regions.

10. Semiconductor means for detecting electromagnetic radiation comprising, in combination:

a plurality of transistor means arranged in an array, each of said transistor means having a channel means connecting first and second regions of like conductivity-type semiconductor material, first gate means having a high relative impurity concentration with respect to said channel means, and second gate means having a low relative impurity concentration with respect to said channel means, said second regions being connected in common;

a plurality of first conductors connected to said first gates; and a plurality of second conductors connected to said first regions whereby signals coincidently applied to one of said first conductors and one of said second conductors select one of said transistor means, the signal applied to said one of said first conductors conditioning the selected one of said transistor means to provide an output signal dependent on the electromagnetic radiation incident on said selected one of said transistor means on said one of said second conductors.

References Cited

UNITED STATES PATENTS

| | | | |
|---|---|---|---|
| 3,230,428 | 1/1966 | Evans | 317—234 |
| 3,254,280 | 5/1966 | Wallace | 317—237 |
| 3,305,913 | 2/1967 | Laro | 317—235 X |
| 3,333,115 | 7/1967 | Kawakami | 317—235 X |
| 3,366,802 | 1/1968 | Hilbiber | 307—251 |

JAMES D. KALLAM, *Primary Examiner.*

U.S. Cl. X.R.

307—303, 304, 311